United States Patent [19]

Dougherty

[11] Patent Number: 4,658,323

[45] Date of Patent: Apr. 14, 1987

[54] RMS CALCULATION CIRCUIT FOR DIGITAL CIRCUIT INTERRUPTERS

[75] Inventor: John J. Dougherty, Avon, Conn.

[73] Assignee: General Electric Company, New York, N.Y.

[21] Appl. No.: 743,337

[22] Filed: Jun. 10, 1985

[51] Int. Cl.$^4$ ............................................. H02H 3/26
[52] U.S. Cl. ....................................... 361/79; 361/85; 361/87; 361/93
[58] Field of Search ...................... 361/78, 79, 85, 87, 361/93; 377/47

[56] References Cited

U.S. PATENT DOCUMENTS

| | | | |
|---|---|---|---|
| 3,739,156 | 6/1973 | Gebelein, Jr. et al. | 377/47 |
| 4,034,269 | 7/1977 | Wilkinson | 361/79 |
| 4,038,695 | 7/1977 | De Puy | 361/96 |
| 4,056,774 | 11/1977 | Shum | 324/142 |
| 4,079,434 | 3/1978 | Elmore | 361/85 |
| 4,250,449 | 2/1981 | Shum | 324/142 |
| 4,339,722 | 7/1982 | Sydor et al. | 377/47 |

Primary Examiner—M. H. Paschall
Assistant Examiner—Jeffrey A. Gaffin
Attorney, Agent, or Firm—Richard A. Menelly; Walter C. Bernkopf; Fred Jacob

[57] ABSTRACT

The root mean square value of sensed current within a protected circuit is used to determine the occurrence of an overcurrent condition. A frequency multiplying circuit produces a pulse stream having a frequency proportional to the square of the amplitude of an analog signal representation of the circuit current. A root mean square value over a prescribed interval is developed from the squared current value. The RMS value is processed within an integrated circuit trip unit to determine an overcurrent condition and to operate a pair of separable contacts to interrupt the circuit current.

1 Claim, 10 Drawing Figures

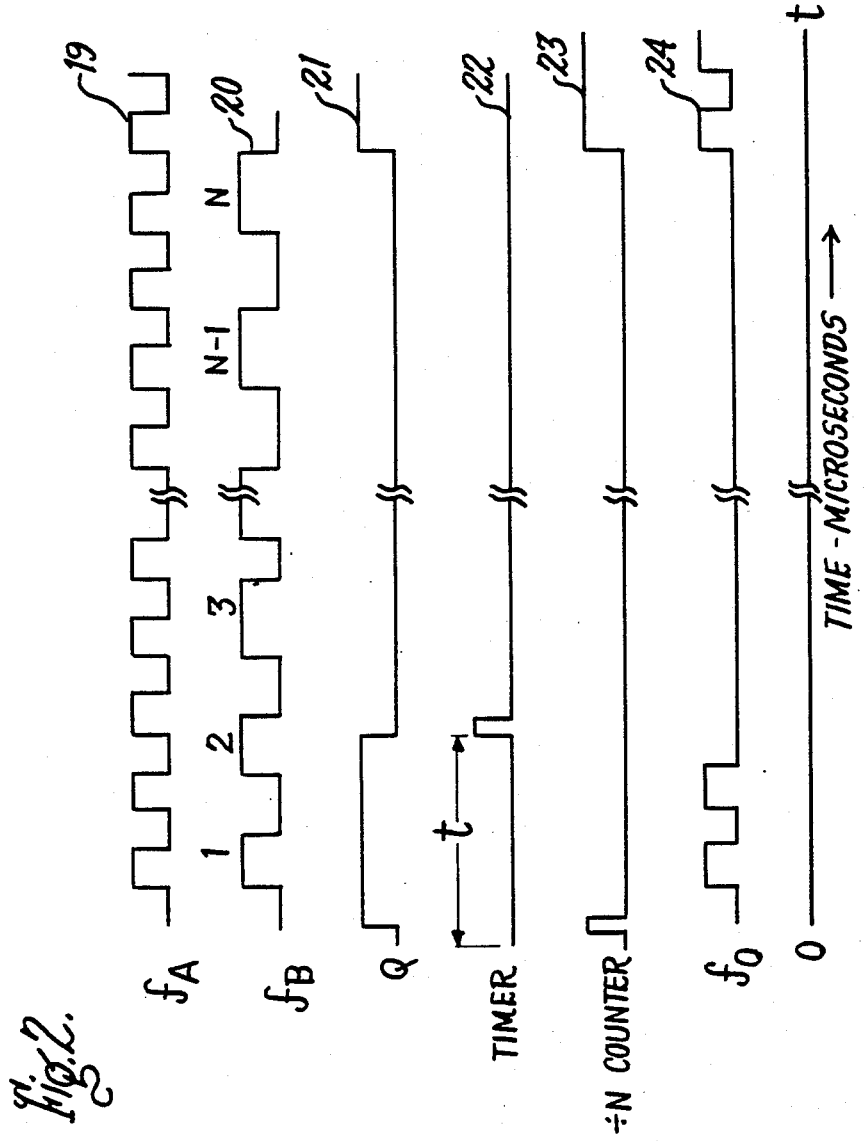

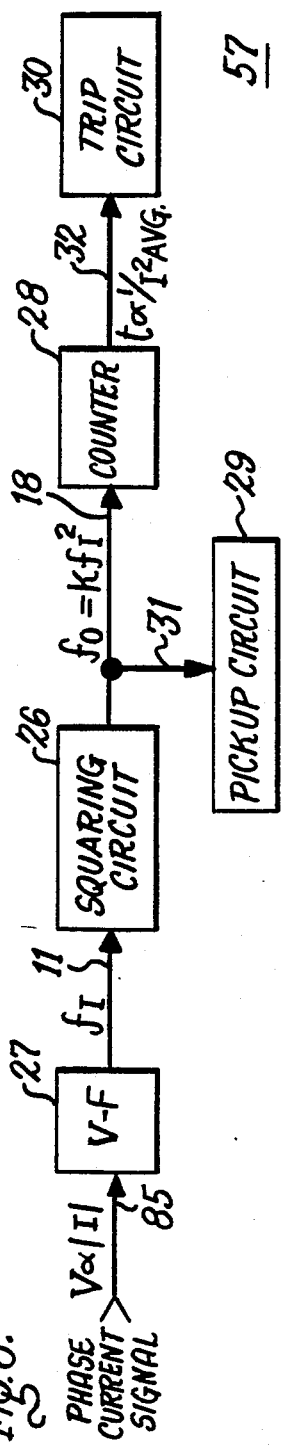
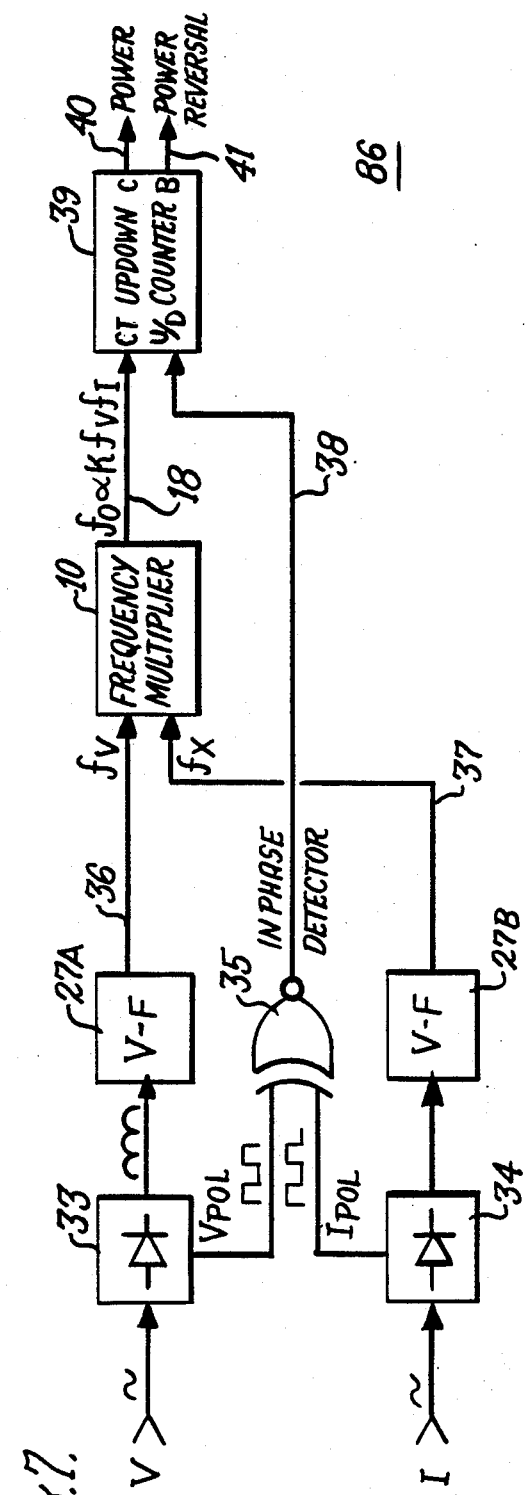

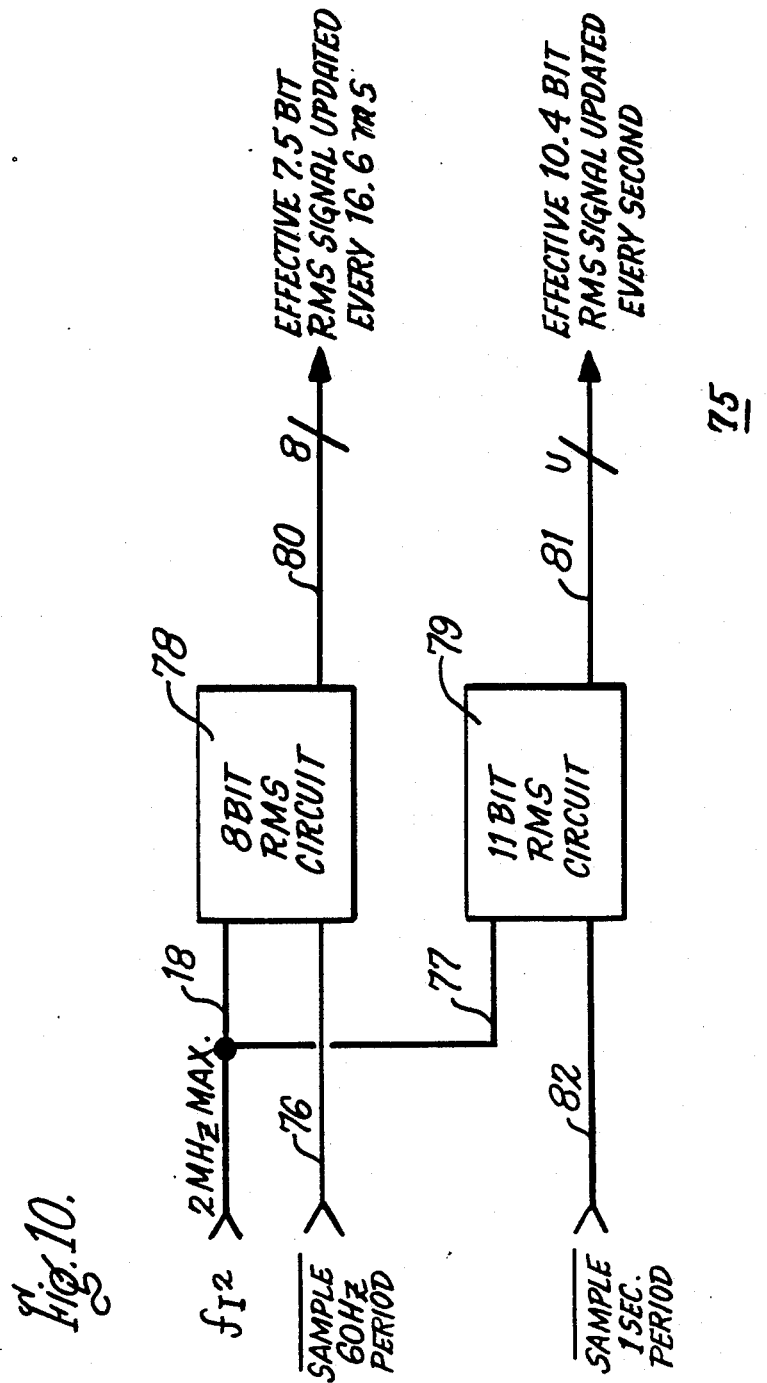

RMS CALCULATION CIRCUIT FOR DIGITAL CIRCUIT INTERRUPTERS

BACKGROUND OF THE INVENTION

A digital circuit interrupter capable of complete implementation by means of very large scale integrated circuit techniques is described within U.S. patent application Ser. No. 631,708 filed July 17, 1984 in the name of John J. Dougherty. The circuit provides digital implementation of overcurrent determination and time delay for interrupting current through a circuit upon comparison with predetermined current values. The circuit employs a peak detecting A/D converter wherein the composite sensed circuit current is compared with the output of a D/A converter and a fixed clock pulse is compared to the output of this comparison. An $I^2t$ digital value controlled by the peak value of the composite current is used as a measure of the current through the protected circuit.

When peak current is sensed within a protected circuit in industrial applications, there have been occurrences of false tripping caused by distorted current waveforms where 5th and 7th harmonic components can add to the peak value causing the peak value to exceed predetermined long time and short time pick-up values resulting in so-called "nuisance tripping" with accompanying loss in productivity. The electrical circuit must be independently tested to insure that no fault current actually exists before the circuit breakers can be reclosed and the industrial equipment can be made operational. This condition is more prevalent in electrical transmission and distribution systems employing power factor correction by the addition of large capacitor banks which tend to distort the sinusoidal waveform components. When highly inductive loads are employed, such as large induction furnaces, the sensed current waveform becomes harmonically distorted such that the 7th harmonic component adds to the peak current value causing an apparent overcurrent condition although the actual RMS current value is well below accepted limits. It has been determined that the current waveform distortion is not a problem when the RMS value of current is sensed, rather than the peak value as is now the custom in most industrial power circuits. RMS detection also provides a more realistic evaluation of the actual heating effect upon the power buses which are protected by the circuit interruption equipment within the protected circuit.

This invention therefore proposes a digital circuit interrupter for circuit protection wherein RMS calculation is made on a continuing basis as a measure of the composite current flowing through the protected circuit.

SUMMARY OF THE INVENTION

Digital overcurrent protection is provided by generating a pulse stream representation of current having a frequency proportional to the square of the amplitude of the analog current signal. The squared current value is integrated over a prescribed interval and a root mean square value is determined therefrom.

BRIEF DESCRIPTION OF THE DRAWINGS

FIG. 2 is a graphic representation of the timing diagrams for the frequency pulses generated within the circuit of FIG. 1;

FIG. 6 is a diagrammatic representation of an RMS protection circuit according to the invention;

FIG. 7 is a diagrammatic representation of a power calculation circuit according to the invention;

FIG. 10 is a diagrammatic representation of a multiple RMS calculation circuit according to the invention.

DESCRIPTION OF THE PREFERRED EMBODIMENT

Figure 1:
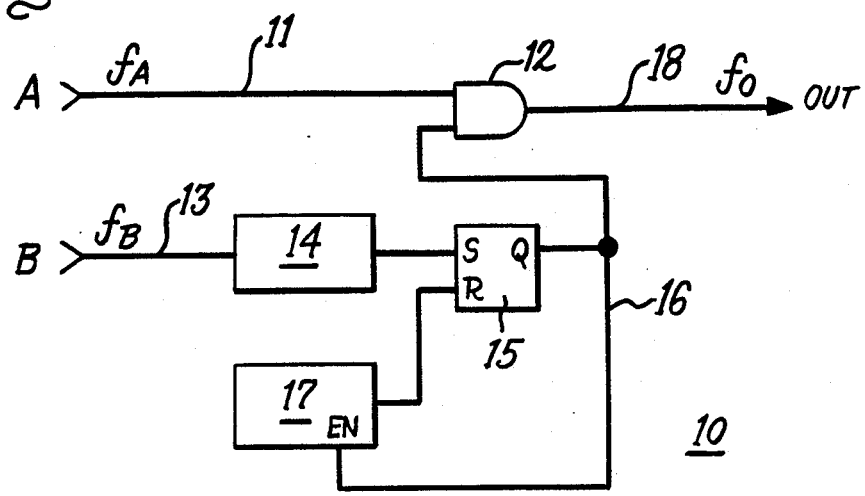
FIG. 1 is a diagrammatic representation of a frequency multiplying circuit according to the invention.

A frequency multiplying circuit 10 is depicted in FIG. 1 and consists of an input line 11 connected with a source A of one frequency $f_A$. The source can comprise a voltage to frequency converter (V/F) such as the type that converts the magnitude of a current or voltage analog signal into a frequency which can then be operated on digitally. The analog input signal, for example, could control the bias of a varactor diode used as the frequency determining component of a resonance circuit within an oscillator such that the frequency of oscillation would depend on the value of the input signal. An advantage of the voltage to frequency A/D converter is that it provides a digital representation of the average value of the input during the conversion interval. The $f_A$ frequency input line 11 is connected to one input of an AND gate 12. A separate source of frequency B is connected over an input line 13 to a divide-by-N counter 14 and the output of the counter is connected with the SET input of an RS flip flop 15. The RESET input is connected to a fixed timer 17, the ENABLE input of the timer is connected with the Q output of the flip flop and to the other input of the AND gate 12 over conductor 16. The timer is enabled when the flip flop is "set", that is, when the Q output is in a "high" state. The output line 18 provides a frequency $f_O$ which is a function of the product of $f_A$, $f_B$ as shown by referring now to the timing diagrams depicted in FIG. 2. These diagrams represent a single cycle timing diagram represented on a common time-base axis for each of the terminals depicted in the frequency multiplying circuit 10. Each of the pulses depicted represent the presence (1) or the absence (0) of a voltage signal, that is, a "high" or a "low" state as indicated. The cycle begins as the binary counter 14 ends its count. A high output sets the flip flop and a high Q signal is then applied to one input of the AND gate. With one input high, the output of the AND gate on line 18 will follow the state of the other input and is a function of the frequency $f_A$ over input line 11. When the flip flop is set, two other processes begin. The fixed timer 17 is started and the binary counter 14 starts from its maximum count. After a time increment t, the timer resets the flip flop and no signals appear on the output line 18 from the AND gate. The relationship between the high and low states on the input line for $f_A$ is shown at 19 for comparison to the input represented by the pulses of increasing pulse width from 1 to n for the input line 13 for $f_B$ as shown at 20. The condition of the Q output of the flip flop is depicted at 21 for comparison with the state of the constant timer shown at 22. The time delay t is indicated as the time in which the Q output remains high. The state of the binary counter 14 which is represented as a divide-by-N counter, is shown at 23 and the condition of the output line 18 carrying the output frequency $f_o$ from AND gate 12 is represented at 24.

The mathematical relationship between the number of pulses p representing the frequency $f_o$ on the output line 18 is given by the expression:

$$p = \frac{t}{1/f_a} = f_a t$$

The flip flop remains reset, inhibiting pulses, until the cycle is completed by the binary counter 14. The binary counter starts a new cycle after n pulses are received on the input line 13 carrying frequency $f_B$ The time for the total cycle is given by the expression:

$$T = n \times \frac{1}{f_b} = \frac{n}{f_b}$$

The output frequency $f_o$ has a value over the cycle given by the expression:

$$f_o = \frac{P}{T}$$

Substituting for the above results in the expression:

$$f_o = f_a \frac{t}{n/f_b} = \frac{t}{n} f_a f_b$$

Figure 3:
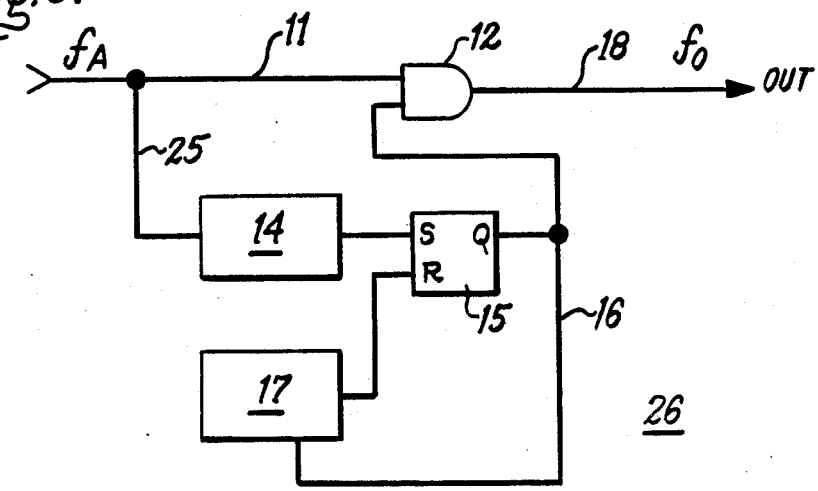
FIG. 3 is a diagrammatic representation fo a frequency squaring circuit according to the invention.

FIG. 3 shows a frequency squaring circuit 26 wherein the frequency source B depicted earlier in FIG. 1 is eliminated and the binary counter 14 is coupled with the input line 11 carrying the single frequency $f_A$. Similar elements are identified by common reference numerals and the circuit operates in the manner previously described with the following result.

The time for the total cycle is now given by the expression:

$$T = \frac{n}{f_a}$$

which becomes, by substitution, $$f_o = \frac{t}{n} \times f_a^2.$$

Figure 4:
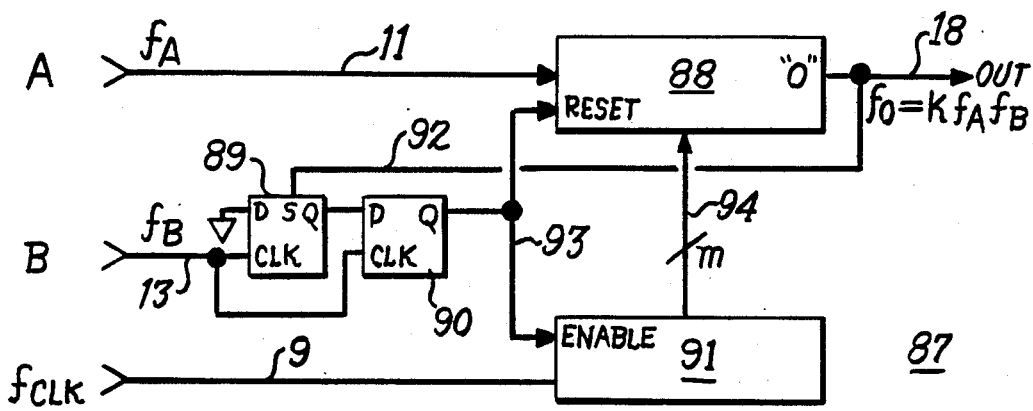
FIG. 4 is a diagrammatic representation of an alternate frequency multiplying circuit according to the invetion.

A simplified frequency multiplying circuit 87 is shown in FIG. 4 with the frequency Source A connected with an input to a divide-by-N counter 88 over input line 11 and with the frequency Source B connected in common over input line 13 with the CLK terminals of a DSQ flipflop 89 and a DQ flipflop 90. A clock frequency is provided over input line 9 to the input of an UP-counter 91. The PRESET terminal of the divide-by-N counter 91 and the ENABLE terminal of the UP-counter are interconnected over conductor 93 with the Q output of the DQ flipflop 90. The Q output of the DSQ flipflop 89 is connected with the D input to the DQ flipflop and the S output of the DSQ flipflop is connected with the output line 18 over conductor 92. The m-data bits from UP-counter are supplied to an input to the divide-by-N counter over multiple conductor 94.

When the divide-by-N counter 88 equals "Ø" pulses, the UP-counter is enabled for one period of the input frequency $f_A$. During this period the UP-counter accumulates $f_{CLK}/f_B$ pulses where $f_{CLK}$ is larger than the maximum value of either $f_a$ or $f_B$. The time t between "Ø" pulses is given by the expression:

$$t = (f_{CLK}/f_B)(1/f_A) = \frac{1}{f_{OUT}};$$

therefore $f_{OUT} = K f_A f_B$, where $K = \frac{1}{f_{CLK}}$

Figure 5:
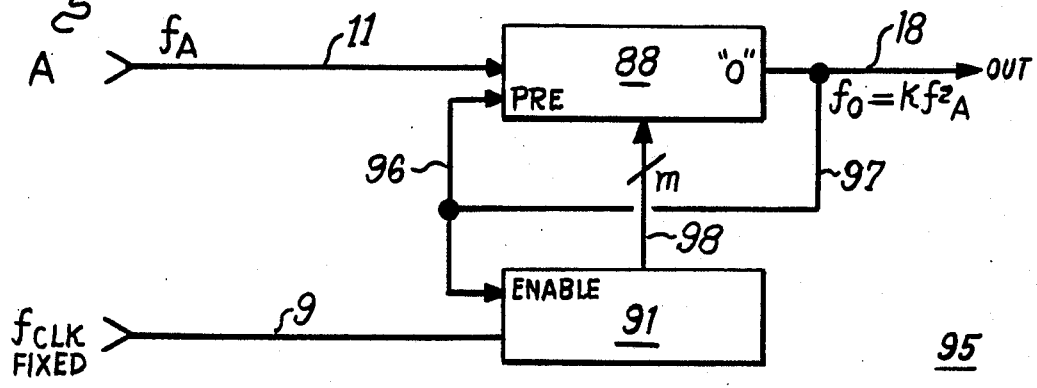
FIG. 5 is a diagrammatic representation of an alternate frequency squaring circuit according to the invention.

A simplified frequency squaring circuit 95 is shown in FIG. 5 where the frequency source A is connected with an input to a divide-by-N counter 88 over input line 11. The fixed clock pulse is connected over input line 9 to one input to the UP-counter 91. The PRESET terminal of the divide-by-N counter is interconnected with the ENABLE input to the UP-counter over line 96 and with the output line 18 over line 97. The m-bit data output from the UP-counter is inputted to the divide-by-N counter over conductor 98.

The frequency squaring circuit 95 operates in a similar manner to the aforementioned frequency multiplying circuit 87 except that the UP-counter now accumulates $f_{CLK}/f_A$ counts during one period of the input frequency $f_A$ when the divide-by-N counter 88 equals "Ø" pulses. The divide-by-N counter is preset to the UP-counter value ($f_{CLK}/f_A$) on the trailing edge of the "Ø" pulse and the UP-counter is cleared. The time t between "Ø" pulses is now given by the expression:

$$t(f_{CLK}/f_A)(1/f_A) \text{ and}$$

$$f_o = 1 \text{ pulse}/(f_{CLK}/f_A^2) \text{ seconds}$$

which simplifies to:

$$f_o = K f_{A2} \text{ where } K = 1/f_{CLK}$$

One application of the frequency squaring function is that of a current conditioning circuit consisting of the V-F converter 27 and the frequency squaring circuit 26 within the RMS overcurrent protection circuit depicted generally at 57 in FIG. 6. The protection circuit finds application within a digital circuit interrupter such as described within the aforementioned U.S. Patent Application. The digital I²t function and peak detecting A/D converter circuits within the referenced digital circuit interrupter are replaced by the squaring and voltage-to-frequency converter circuits 26 and 27 to provide the current conditioning function. The pickup and trip circuits 29 and 30 are identical to those described within the aforementioned U.S. Patent Application, wherein three current sensing transformers, one inserted within each of the three power phases within a protected circuit, supply continuous current value to a burden resistor resulting in a voltage value proportional to the absolute value of the sensed current. This voltage value is supplied over input line 85 to a voltage to frequency converter 27 which generates a frequency value $f_I$ that varies in proportion to the sensed current. This value is provided over input line 11 to the squaring circuit 26 which contains the elements depicted earlier in FIG. 3 and wherein an output frequency $f_O$ is derived having a value proportionate to $f_I^2$ and which is provided over conducter 18 to an averaging counter 28 and over conductor 31 to the pickup circuit 29. The pickup circuit responds to predetermined values of the sensed current as now represented by $f_I^2$ whereas the averaging counter 28 provides a time delay over conductor 32 which is proportional to the inverse value of the average of the square of the current as indicated. This value is used within the trip circuit 30 for determining the characteristic long and short time delays before operating the trip mechanism. It is noted that in RMS protection the square root of the mean square is squared to provide the time factor employed in determining time overcurrent before tripping i.e. I²t. Since this defines the mean square, the output of the averaging counter 28 can be used directly, as indicated. The pickup circuit 29 must also average the squared frequency output, i.e. $f_I^2$ to determine pickup based upon the square of the trip pickup setting as described in detail within the aforementioned U.S. Patent Application.

The frequency multiplying circuit 10 of FIG. 1 is used within the power calculation circuit 86 depicted in FIG. 7. The circuit voltage value V is rectified within a rectifier 33 and the DC voltage is fed into one voltage-to-frequency converter 27A and a polarity signal responsive to the polarity of the input voltage signal is applied to one input of an EXCLUSIVE-NOR gate 35. The current value within the protected circuit is rectified within a separate rectifier 34 and the DC current value is supplied to a separate voltage-to-frequency converter 27B. Again, a polarity signal responsive to the polarity of the input current is applied to the other input of EXCLUSIVE NOR gate 35. The frequency representation of the rectified circuit voltage $f_V$ supplied to the frequency multiplier over conductor 36, and the frequency representation of the rectified circuit current $f_I$ supplied to the frequency multiplier over conductor 37 are continuously multiplied within the frequency multiplier to provide an output frequency $f_o$, which is proportional to the product of both frequencies, and is applied over conductor 18 to the CT terminal of an UP-DOWN counter 39. The voltage and current polarity signals are multiplied together within the EXCLUSIVE-NOR gate 35 which is employed as an IN-PHASE detector. The IN-PHASE signal controls the state of the UP/DOWN counter by connection over conductor 38 with the U/D terminal. The CARRY output C of the UP/DOWN counter provides the average forward power pulses over conductor 40 and the BORROW output B provides indication of a power reversal over conductor 41.

The RMS value of circuit current and voltage can have other useful applications within the protected circuit such as metering, for example. The RMS calculation circuit 57 depicted in FIG. 8 can take the frequency value $f_o$, provided by the frequency squaring circuit 26 of FIG. 3, and provide this value as the frequency representation of the square of the circuit current, $f_I^2$, over input line 18 and by the interconnection of a divide-by-N counter 42, an UP counter 44, M+1 bit latch 49 and m-bit full adder 50 produce an m-bit RMS value on multiple output line 56. Before describing the details of the RMS determining circuit it is helpful to describe the mathematic functions performed therein. A known iterative procedure for calculating the square root of any number is given by the expression:

$$Ai + 1 = \frac{Ai}{2} + \frac{X}{2Ai} = \frac{1}{2}\left(Ai + \frac{X}{Ai}\right)$$

wherein i represents the iteration index of the series expression, $A_i$ represents the last estimate of the square root value and X represents the number which equals the square value. The series converges very rapidly on the square root value with a reasonable initial value for A. The root mean square value of an electrical signal over a prescribed time T is given by the expression:

$$RMS = (X^2_{AVG}/T)^{\frac{1}{2}}$$

where $X^2_{AVG}$ equals the average value of the square of the signal X and RMS equals the root mean square value.

Figure 8:
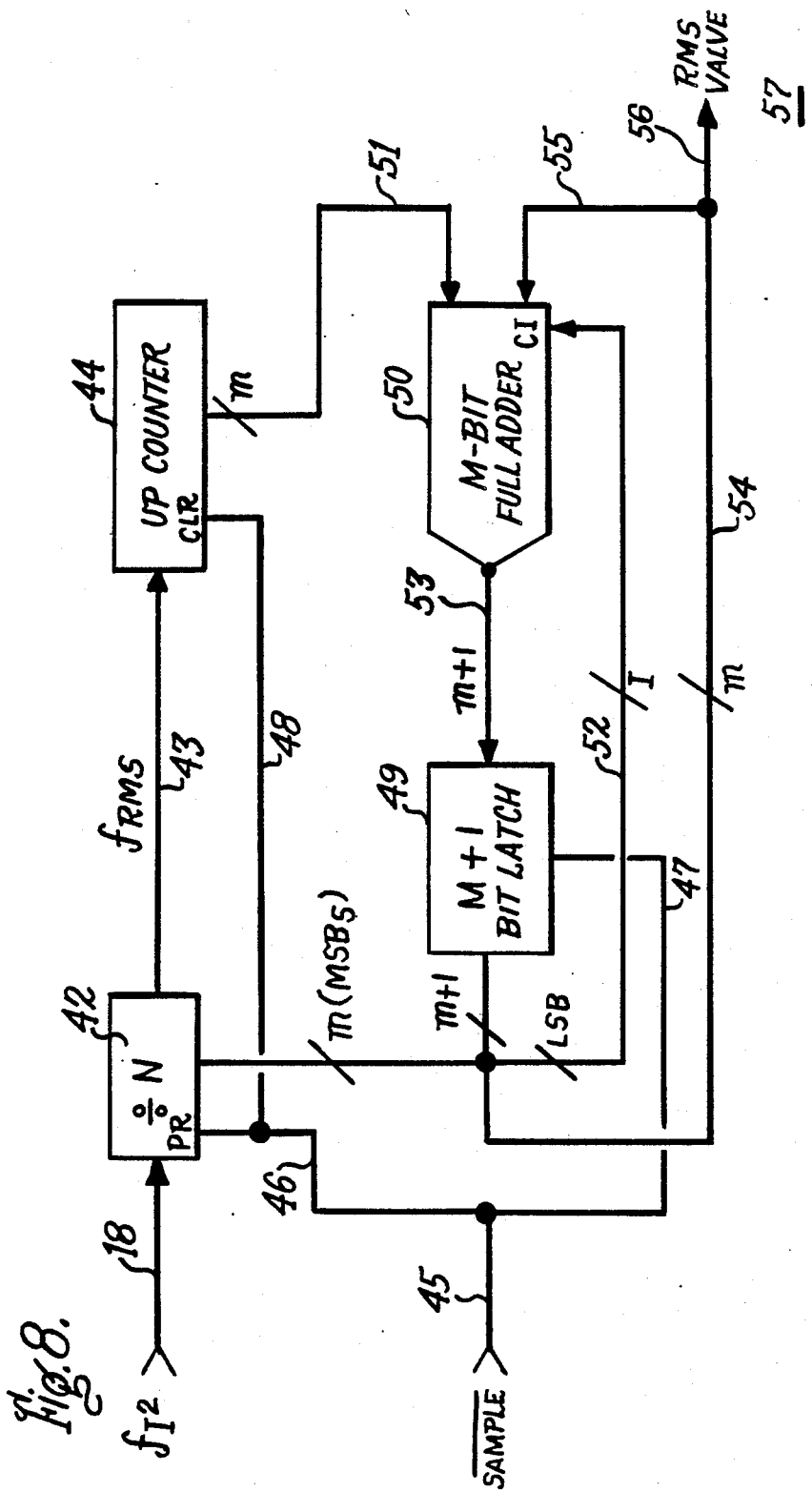
FIG. 8 is a diagrammatic representation of an RMS calculation circuit according to the invention.

Referring again to the RMS circuit 57 of FIG. 8 the aformentioned mathematical function is performed digitally in the following manner. The input signal proportional in frequency to the square of an input current I, such as with the frequency squaring circuit 26 of FIG. 3, is applied over input line 18 to the input of a divide-by-N counter 42. The dividing factor of this counter is an m-bit digital value which relates to the expression "$A_i$" described earlier. The output of the divide-by-N counter is applied over conductor 43 to a simple binary UP-counter 44. The m-bit output from the UP-counter, which is applied to an m-bit full adder 50 over conductor 51, corresponds to the term $X \div A_i$. The SAMPLE signal is a timing pulse from a clock (not shown) designed to implement the calculation of an RMS signal, the period of which corresponds to the prescribed time T in the earlier expression for the RMS calculation. The SAMPLE timing pulse over input line 45 is connected with the PR terminal of the divide-by-N counter 42 over conductor 46 and with one input to an m+1 bit latch 49 over conductor 47. The SAMPLE timing pulse is connected with the CLR input to the UP-counter 44 over conductor 48. The m+1 data bits from the m-bit full adder 50 are inputted to the m+1 bit latch 49 over conductor 53. The m most significant data bits from the m+1 bit latch are applied to one input of the divide-by-N counter 42 and the least significant data bit is applied to the CARRY-IN input of the m-bit full adder 50 over line 52 and the other input to the m-bit full adder 50 is supplied with the m most significant data bits over conductors 54 and 55. The output line 56 which joins conductors 54, 55 carries the resultant RMS binary value.

In performing the RMS calculation, the RMS circuit operates in the following manner. Upon receipt of the SAMPLE pulse, the UP counter 44 has been cleared and a new value $A_i$ has been set into the divide-by-N counter 42. For a period of time T, the UP counter 44 accumulates pulses at the following rate:

$$f_{RMS} = f_I^2 \div A_i.$$

After the period of time T, the UP counter 44 has accumulated $f_I^2 \times T \div A_I$ counts which is applied to one input of the m-bit full adder 50 over conductor 51. Another input to the m-bit full adder receives the last estimate $A_i$. Upon receipt of the SAMPLE pulse the two inputs to the m-bit full adder and the CARRY-IN bit from the least significant bit of the m+1 bit latch 49 are added and the output is the m-bit + the CARRY-bit, (m+1), which is represented by the expression $$A_i + f_I^2 \times T \div A_i.$$

A new estimate of the RMS value can be obtained by dividing this expression by two. In binary notation this is achieved by shifting the dividend $A_{i+1}$ by one bit. This is performed within the RMS circuit of the invention by using the CARRY bit of the m+1 adder as the most significant bit (MSB) of the new estimate and using the m−1 most significant outputs of the m-bit full adder stages. The trailing edge of the SAMPLE pulse is used to latch the new RMS estimate, clear the UP counter 44 and preset the divide-by-N counter 42.

Figure 9:
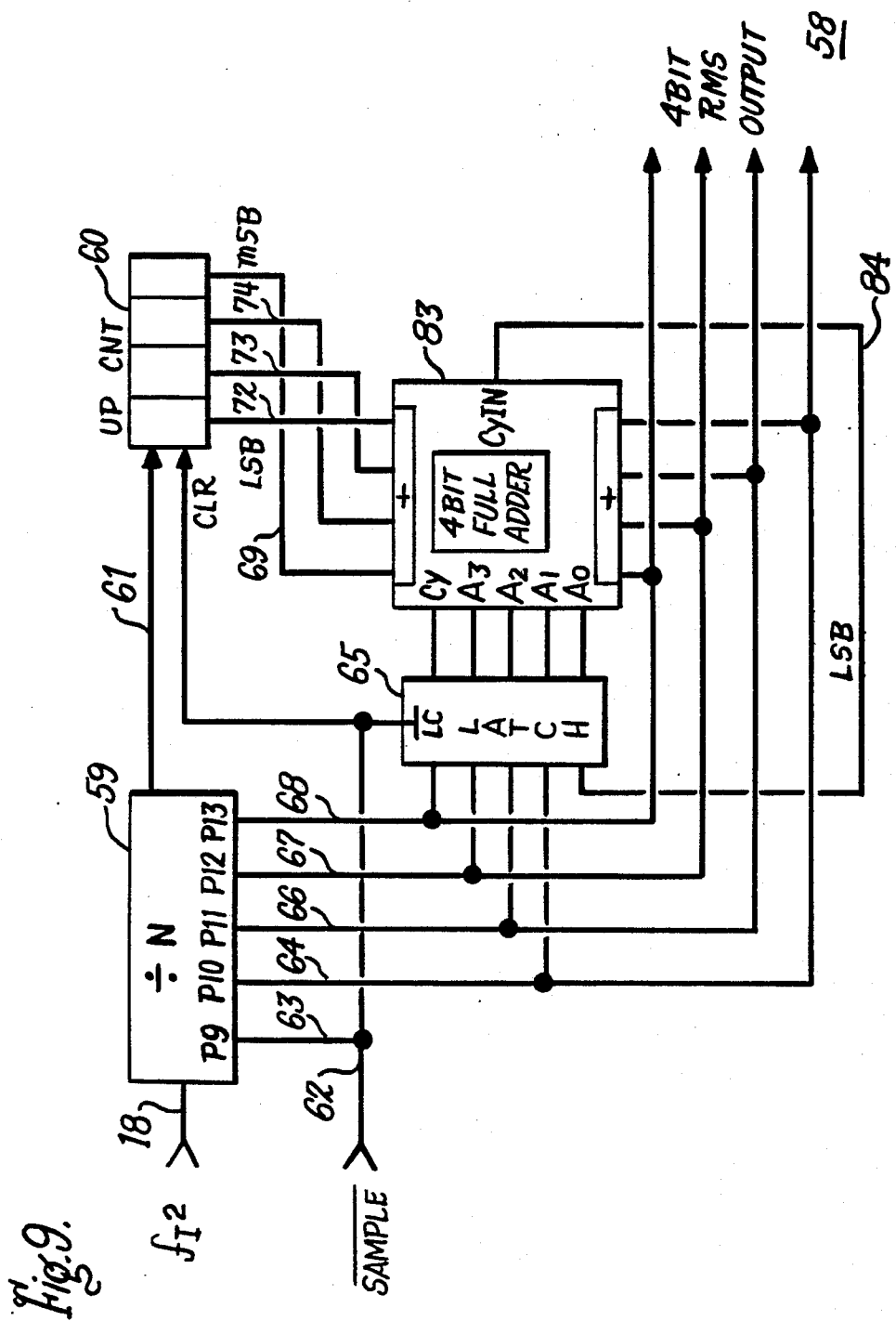
FIG. 9 is a diagrammatic representation of a 4-bit RMS calculation circuit according to the invention.

A 4-bit RMS calculation circuit 58 is shown in FIG. 9 where the divide-by-N counter 42, the UP counter 44, m+1 bit latch 49 and m-bit full adder 50 RMS circuit 57 of FIG. 6 are replaced respectively by the divide-by-N counter 59, 4-bit UP counter 60, 4-bit latch 65 and 4-bit full adder 83. The frequency representative of the current squared ($f_I^2$) is connected with the divide-by-N counter 59 by means of input line 18 and the output of the divide-by-N counter is connected to one input of the UP counter 60 by means of conductor 61. The SAMPLE pulses are connected to the pin 9 terminal of the divide-by-N counter over conductor 63, to the LATCH terminal of latch 65 and to the CLEAR terminal of the UP/DOWN counter 60 over conductor 62. The latch output terminals are connected to the divide-by-N pin 10, pin 11, pin 12, and pin 13 terminals over conductors 66,67 and 68 respectively. The latch input terminals are connected to the CARRY and $A_0$–$A_3$ OUTPUT terminals of the 4-bit full adder 83 as indicated. The CARRY-IN input of the 4-bit full adder is connected with an output of the latch 65 for generating the least significant data bit (LSB) to the 4-bit full adder over conductor 84. The most significant data bit (MSB) is provided from the UP counter 60 to the 4-bit full adder 83 over conductor 69 and the least significant data bit (LSB) is provided to the 4-bit full adder over conductor 72. The remaining input terminals of the 4-bit full adder are interconnected with the counter output terminals by means of conductors 73 and 74. The conductors 66, 67 and 68 which interconnect the latch 65 and the 4-bit full adder comprise the 4-bit RMS output. The least significant bit (LSB) of the output of the 4-bit full adder 83 is used in calculating the next result by looping into the CARRY-IN input which comprises the least significant adder stage to effect a "rounding up" of the discarded data bit. For practical purposes, the UP counter 60 must be prevented from "rolling over", that is, exceeding the maximum count and returning to zero. Some circuitry is required to either hold the counter at a maximum count or set all of the 4-bit full adder inputs at a maximum. The selection of the number of bits of resolution is linked to the maximum input signal of interest and the period P for which the RMS value is desired. At steady state conditions the following mathematical expressions apply:

$$A_{i+1} = (f_I^2 \times T \div A_i + A_i) \div 2$$

For the m-bit full adder 50 of FIG. 9 saturation occurs at $f_I^2 \max$ as seen from the following expression:

$$A_I = 2^m - 1 = f_I^2{}_{max} \times T \div (2^m - 1.)$$

This simplifies to:

$$(2^m - 1)^2 = f_I^2{}_{max} \times T.$$

The actual resolution for the 4-bit RMS circuit 58 depicted in FIG. 9 is $2^m - 1$ where m=4. If the RMS value is desired over a single 60 Hz cycle where the period T is 16.6 ms, the frequency squaring circuit 26 depicted in FIG. 3 at full scale analog input, should be designed for a pulse rate given by the following expression:

$$f_I^2{}_{max} = (2^m - 1)^2 \div T = 15^2 \div 0.1666 = 13500 \text{ Hz}.$$

Since the RMS circuit does not alter the input signal, several circuits of varying periods can be paralleled to measure RMS values over different time intervals for obtaining even higher resolutions.

FIG. 10 depicts a multiple RMS calculation circuit 75 wherein an 8-bit RMS circuit 78 is connected in parallel with an 11-bit RMS circuit 79. A frequency $f_I^2$ proportional to the circuit current squared is inputted to the 8-bit RMS circuit 78 over line 18 and to the 11-bit RMS circuit 79 over line 77. A SAMPLE pulse having a frequency of 60 Hz is inputted to the 8-bit RMS circuit over conductor 76 and an additional SAMPLE pulse having a period T of one second is inputted to the 11-bit RMS circuit over conductor 82. An effective 7.5-bit RMS signal appears over conductor 80 and is updated every 16.6 milliseconds while an effective 10.4-bit RMS signal appears over conductor 81 and is updated every second. The mathematical expression for this combined circuit is given for a maximum square frequency $f_f^2$ of 2 mHz over a 16.6 millisecond time interval i.e., 60 Hz cycle with the following results:

$$(2^m - 1)^2 \approx 2^{2m} = f^2_{max} T$$

solving for m results in the following expression:

$$m = \tfrac{1}{2} \frac{\ln(f^2 max\ T)}{\ln 2} = \frac{\ln(2 \times 10^6/60)}{2(.693)}$$

The value for m is equal to 7.5 for the example given and results in a resolution of 0.5%. Although this resolution is suitable for control purposes, a one second interval for T is more acceptable for purposes of measurement, and the m value for the one second time interval results in the following expression:

$$m = \tfrac{1}{2} ln\ (2 \times 10^6) \div 0.693 = 10.4$$

with a resolution of 0.07%.

It has thus been shown that the application of a frequency multiplying circuit results in RMS representation of analog voltage and current values. The use of the voltage-to-frequency conversion circuit of the invention in combination with frequency multipliers and UP/DOWN counters results in a means for accurate power and power reversal indication. The RMS circuit effectively provides the RMS calculation in combination with digital overcurrent detection and interruption facility. By cascading a plurality of RMS sub-circuits resolution can be accomplished with sufficient accuracy to be used for metering where very accurate values of circuit voltage and current are required.

Having described my invention, what I claim as new and desire to secure by Letters Patent is:

1. A current conditioning circuit for a digital circuit interrupter comprising:

voltage-to-frequency conversion means whereby current through a protected circuit is first converted to a voltage and wherein said voltage is converted to an input frequency, said input frequency comprising a plurality of pulses proportional to said circuit current;

a frequency squaring circuit comprising an AND gate, a fixed timer and a divide-by-N counter interconnected by means of an RS flip flop, an input to said AND gate and said divide-by-N counter being connected in common with said voltage-to-frequency converter, a SET input to said flip flop being connected to an output from said divide-by-N counter, an output from said fixed timer being connected with a RESET input to said flip flop and a Q output from said flip flop being connected in common with both an ENABLE input to said fixed timer and another input to said AND gate providing an output frequency from said AND gate proportional to a multiple of said input frequency;

digital pickup circuitry means for determining from said output frequency when said circuit current exceeds predetermined pick-up values; and trip circuitry means connected with said output frequency through a second counter, said second counter comprising an averaging counter providing a time delay to said trip circuit proportional to the inverse value of the average of the square of said circuit current, whereby a time increment is generated in inverse porportion to siad output frequency, said trip circuit then initiating a trip operation when said circuit current exceeds said pickup value for predetermined periods of time.

* * * * *